United States Patent
Kishinevsky et al.

(10) Patent No.: US 6,584,597 B1
(45) Date of Patent: Jun. 24, 2003

(54) MODELING OF PHASE SYNCHRONOUS CIRCUITS

(75) Inventors: Michael Kishinevsky, Beaverton, OR (US); Timothy Kam, Portland, OR (US); Loic Henry-Greard, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 09/993,719

(22) Filed: Nov. 27, 2001

(51) Int. Cl.[7] .............................................. G06F 17/50
(52) U.S. Cl. ...................... 716/1; 716/2; 716/3; 716/5
(58) Field of Search ................................... 716/1, 2–10

(56) References Cited

U.S. PATENT DOCUMENTS

| | | | | |
|---|---|---|---|---|
| 5,210,700 A | * | 5/1993 | Tom ................................ | 716/6 |
| 5,550,760 A | * | 8/1996 | Razdan et al. ................. | 703/14 |
| 5,694,579 A | * | 12/1997 | Razdan et al. ................. | 703/14 |
| 5,978,571 A | * | 11/1999 | Grundmann ................... | 703/23 |
| 6,412,099 B1 | * | 6/2002 | Chiba ............................. | 716/6 |

OTHER PUBLICATIONS

Maurizio Damiani and Giovanni De Micheli, *Recurrence Equations an the Optimization of Synchronous Logic Circuits*, 29th ACM/IEE Design Automation Conference Proceedings, pp. 556–561, Jun. 1992.

Rajeev Ranjan, Vigayn Singhal, Fabio Somenzi and Robet Brayton, *Using Combinational Verification For Sequential Circuits*, European Desing Automation Conference (EURO–DAC) Proeceedings, pp. 138–144, 1999.

Karen Sakallah, Trevor Mudge, an Oyekunle Olukotun, *Analysis and Design of Lathc–Controlled Synchronous Digital Circuits*, IEEE Transactions on Computer–Aided Design, 11(3): pp. 322–333, Mar. 1992.

W.K. C. Lam and R.K. Brayton, *Timed Boolean Functions: A unified Formalism for Exact Timing Analysis*, Section 3.1–3.4 (pp. 19–31), Kluwer Academic Publishers, 1994, ISBN 0–7923–9454–2.

\* cited by examiner

*Primary Examiner*—Vuthe Siek
*Assistant Examiner*—Magid Dimyan
(74) *Attorney, Agent, or Firm*—Kenyon & Kenyon

(57) ABSTRACT

Embodiments of the present invention generate equations that model a synchronous circuit that contains sequential elements, which may include transparent elements, and a plurality of multiple-phase clocks. Phase-related information is assigned to nodes of the circuit. The phase-related information describes input and output characteristics at nodes of the circuit as the characteristics relate to clock phases. Equations are formed that model signals at the circuit nodes based on the phase-related information.

10 Claims, 4 Drawing Sheets

MODELING OF PHASE SYNCHRONOUS CIRCUITS

TECHNICAL FIELD

The field of the present invention is that of circuit modeling, and more specifically that of modeling of circuit designs using phase synchronous equations.

BACKGROUND OF THE INVENTION

Logic design of, for example, integrated circuits typically includes a design phase and a verification phase for determining whether a design works as expected. Verification uses software simulation to avoid the cost of first implementing a design in hardware to verify it.

Designs to be verified can be represented in a hardware description language (HDL) "model" that, through simulation, can predict the behavior of a proposed design independently of its physical implementation. The model may be expressed at varying levels of abstraction: some levels may be highly abstract, representing a circuit only in terms of its behavior, while other levels may include more details of physical implementation. One commonly utilized abstraction level is referred to as "register transfer level," or RTL.

Writing models in HDL presents challenges. Accurate modeling of designs may call for a significant level of implementation detail, but too much implementation detail can introduce functional bugs. Generally, the number of bugs in a model is proportional to its size (i.e., the amount of code required to specify the model). More abstract models tend to be smaller in size and may therefore contain fewer bugs. Abstract models also allow for faster simulation and better exploration of design space.

One known technique which has been applied in modeling logic designs and which provides for a useful degree of abstraction and conciseness, is the use of synchronous equations. For example, a combinational AND gate with two inputs, "a" and "b", and output "c", may be modeled as $c(i)=a(i)\ b(i)$ (where the AND operation is indicated by concatenation), where index i serves as a clock counter, and $a(i)$ corresponds to a stable value of signal a at clock count i. As another example, a flip-flop with input x and output y may be modeled as $y(i)=x(i-1)$. Such synchronous equations have been used to model, for example, iterative synchronous algorithms used in DSP (digital signal processing) systems, in control theory and CAD (computer-aided design) for control systems, and in systolic computations as well as other types of computations.

One drawback of using synchronous equations to model logic designs, however, is that they are ill suited to model high-speed circuits. High-speed circuits such as, for example, high-performance microprocessors, require circuit designs that produce very accurate clock phases, utilize transparent latches, and support multiple clock methodologies. Standard synchronous equations cannot model the behavior of circuits with transparent components, multi-phase clocking, and multiple clocks.

An additional problem that arises in the coding of models of logic designs is that typically clock phase information must be manually coded for each signal in a design, which is a tedious, error-prone and time-consuming process. This manual process must be repeated if the clock phase information changes as a result of design changes.

A method and system are needed to address the foregoing concerns.

Detailed Description

Embodiments of the present invention comprise operations to process an abstract representation of a synchronous circuit to generate a set of phase synchronous equations corresponding thereto. Generating the phase synchronous equations may be referred to herein as "modeling" the circuit; similarly, the phase synchronous equations may be referred to as a "model" of the circuit.

A model of the circuit in the form of the phase synchronous equations is advantageous because the model is abstract and succinct, enabling more efficient verification of the corresponding logic design. The equations can be used efficiently to compute stable values of the system, given initial values, every next phase. The values computed using the set of equations correspond to the stable values at the outputs of the gates of the circuit.

Another advantage of the equations is that the model is formal. "Formal" in this context means, for example, that certain properties of the modeled system, or theorems regarding the behavior of the system, can be proven using the equations.

As part of generating the phase synchronous equations, embodiments of the invention may automatically generate clock phase information for nodes of the circuit. This clock phase information is referred to herein as "phase labels." The phase labels describe phase-related behavior at nodes of the circuit.

The abstract representation of the synchronous circuit may be, for example, in the form of digital data stored on a computer-readable medium. Embodiments of the invention may take the form of computer-executable instructions which, when executed by a processor, process the data to generate the phase synchronous equations.

A "netlist" is one possible form of an abstract representation of a circuit such as could be processed according to embodiments of the invention. A netlist may include a specification of all logic gates in the circuit, all connections between the gates, all primary inputs, and all primary outputs. A netlist is typically coded in HDL as RTL-level description.

An example of a set of phase synchronous equations resulting from application of a process according to embodiments of the invention is shown below in Table 1.

TABLE 1

$$e(i) = F(b(i - 1), g(i - 0.5))\ i \in \{1, 2, \ldots\}$$
$$g(i) = F(a(i - 1), e(i - 0.5))\ i \in \{0.5, 1.5, \ldots\}$$

Figure 3:
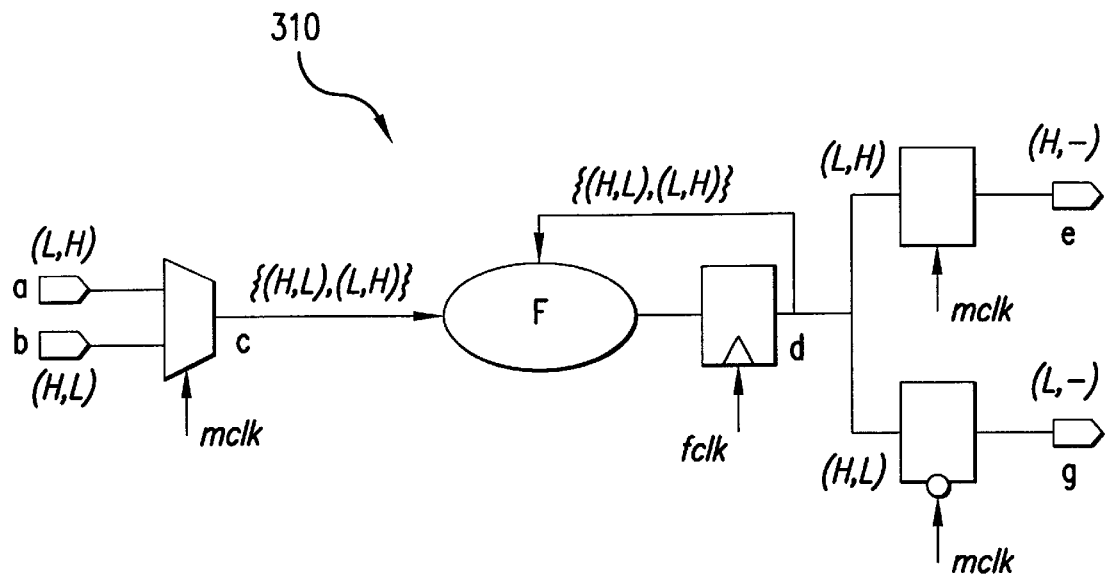
FIG. 3 shows two different circuits that may be modeled by the same set of phase synchronous equations according to embodiments of the invention.
Figure 3:
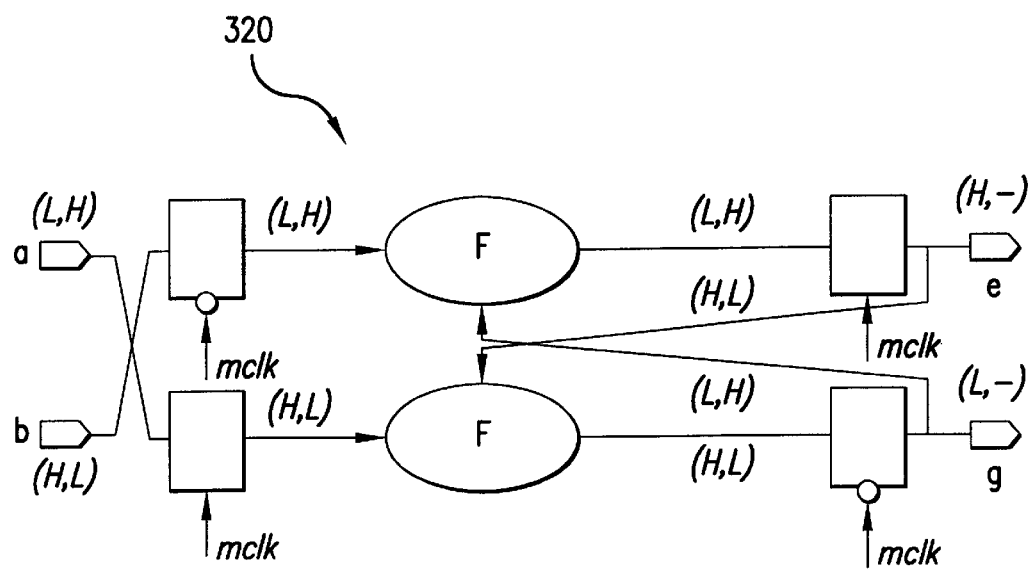

The equations shown in Table 1 model circuits shown in FIG. 3.

Referring now to FIG. 3, circuit 310 comprises a plurality of sequential elements, including a rising-edge flip-flop and two transparent latches, and a combinational element, i.e., a MUX (multiplexer) controlled by the clock, mclk. The ellipse enclosing the "F" symbol denotes an arbitrary function computed by one or a plurality of gates. The circuit is driven by different clocks with different frequencies: "fclk" and "mclk". The frequency of "fclk" may be a multiple of (in this example, double) the frequency of "mclk".

Circuit 320 comprises a plurality of transparent latches and two arbitrary functions "F". Circuit 320 is driven by a single clock, "mclk".

Circuits such as shown in FIG. 3, that is, circuits including transparent latches, combinational elements, clocks of different frequencies, and the like, are typically difficult to understand. As outlined above, conventional modeling techniques are primarily limited to handling synchronous circuits consisting of single-edge, single-clock flip-flops and combinational logic. Handling of transparent latches is at best limited to re-timing. Multiple phases and multiple clocks are not supported. Similarly, classic synchronous equations cannot model transparency, multiple clocks, multiple clock phases, clock gating and clocked logic.

By contrast, processing of representations of the circuits according to embodiments of the invention provides a formal model in the form of equations which explain what the circuits are computing even though they comprise transparent latches, multiple-phase clocks and multiple clocks of different frequencies.

For example, the equations shown in Table 1, which correspond to both circuits 310 and 320, demonstrate that circuits 310 and 320 are equivalent. The equations shown in Table 1 compute the same values, notwithstanding that circuits 310 and 320 comprise differing elements, and notwithstanding that circuit 310 has two clocks while circuit 320 has only one.

Figure 1:
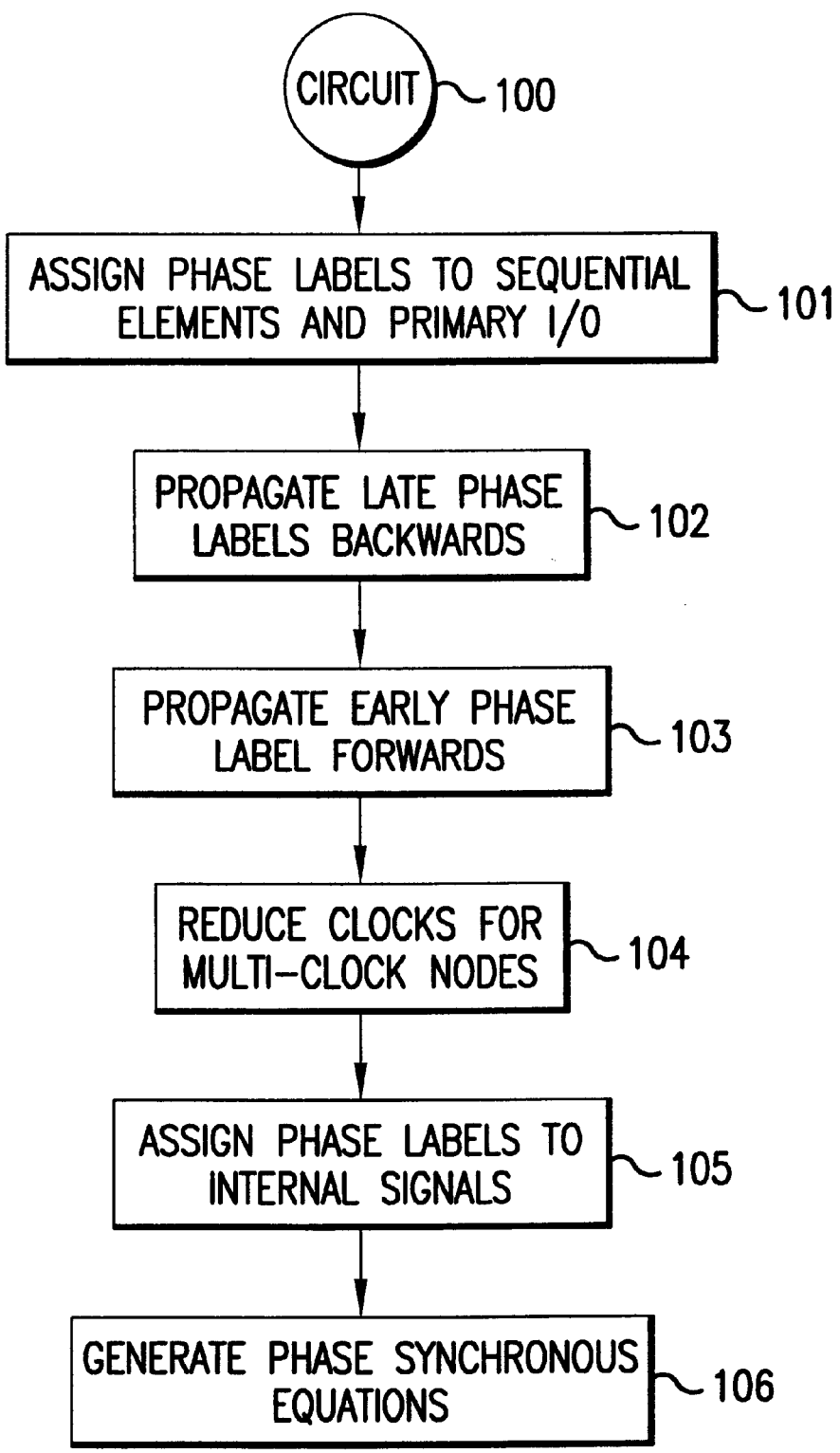
FIG. 1 illustrates a process flow for generating phase synchronous equations according to embodiments of the invention.

To generate phase synchronous equations as described in the foregoing, a process comprising a sequence of operations may be performed as illustrated in FIG. 1. Each operation will be described in detail in the discussion that follows.

As shown in FIG. 1, an abstract representation 100 of a synchronous circuit, for example a netlist, may be provided as input to the process; the process may be implemented using computer-executable instructions according to embodiments of the invention. Hereinafter, for convenience, the abstract representation 100 of the circuit is simply referred to as the "circuit," it being understood that in actual implementation of the process according to embodiments, the circuit would be represented in some form of digital data suitable for being manipulated by computer-executable instructions.

As one initial operation of the process, the circuit may be processed to assign phase labels to each sequential element and primary input and primary output of the circuit as shown in block 101. Sequential elements include flip-flops and transparent latches of either polarity. As discussed in more detail below, the phase labels describe the input and output characteristics of the sequential elements and primary I/O as these characteristics relate to clock phases.

In addition to sequential elements and primary inputs and outputs, a circuit typically includes combinational elements (e.g., AND, OR and other Boolean logic gates, MUXes and the like). Nodes of the circuit which may take on logic values corresponding to the inputs and outputs of the sequential elements and combinational elements are referred to herein as "signals." The primary inputs and outputs are also "signals."

After phase labels have been assigned to the sequential elements and primary I/O of the circuit as shown in block 101, the phase labels may be "propagated" to the internal signals of the circuit. In this context, "propagated" means that information about behavior of "emitters" and "samplers" of each signal, as contained in the phase labels of each emitter and sampler, is provided for each signal to enable a determination of a phase behavior of each signal.

An emitter may be either a primary input or an output of a sequential element, and a sampler may be either a primary output or an input of a sequential element. The propagated phase information is used in a later operation to assign phase labels to each signal according to a set of rules.

More particularly, "late phase" labels may be propagated backwards (i.e., from the primary outputs in the direction of the primary inputs of the circuit) as shown in block 102, and "early phase" labels may be propagated forwards (i.e., from the primary inputs in the direction of the primary outputs of the circuit) as shown in block 103. The meaning of "late phase" and "early phase" will be discussed below.

Next, an operation may be performed to reduce faster clocks to slower clocks for multi-clock nodes, as shown in block 104. In the case of circuits with multiple clocks with different frequencies, this operation may be needed to determine the effect of phases of one clock on phases of another clock. For example, circuit 310 in FIG. 3 includes two clocks of different frequencies, where clock "fclk" has a frequency which is a multiple (a double in this case) of a frequency of clock "mclk." A clock reduction operation could be executed in the case of a circuit such as circuit 310 to determine how or whether events that occur during a phase of "fclk" need to be considered during a phase of "mclk."

Using the phase information computed in the propagation operations outlined above, phase labels may be assigned to the internal signals of the circuit, as shown in block 105. A set of rules, as described in greater detail hereinafter, may be applied, using the propagated phase information to assign the phase labels. As noted above, this automated phase labeling provides advantages by offloading the task from designers.

With phase labels now assigned to sequential elements, primary I/O, and internal signals of the circuits, the phase synchronous, equations may be generated, as shown in block 106. The operation of generating the phase synchronous equations may utilize a shift operator, as also described in more detail below.

An illustrative example of an application of the foregoing operations follows.

Figure 2A:
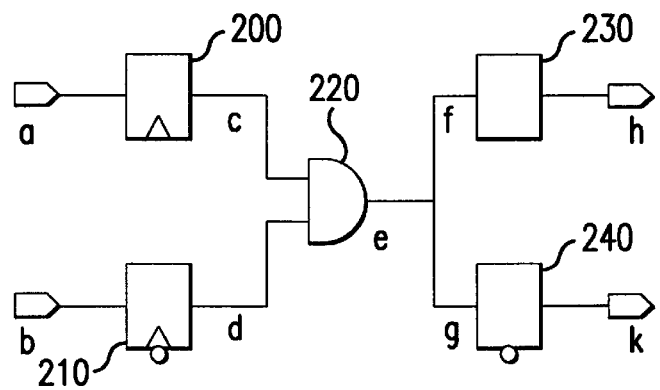
FIG. 2A illustrates an example circuit that could be processed according to embodiments of the invention.

FIG. 2A shows a circuit that might be modeled according to embodiments of the present invention. The circuit comprises primary inputs a and b coupled to a rising-edge flip-flop 200 and a falling-edge flip-flop 210, respectively., Flip-flops. 200 and 210 are both input to AND gate 220. AND gate 220, in turn, is coupled to both active-high transparent latch 230 and active-low transparent latch 240.

"Transparent" in the foregoing context means that when a clock input of the appropriate polarity is present, the latch propagates the value of its input to its output, and when the clock polarity changes, the latch retains its previous value. Latches 230 and 240 are respectively coupled to primary outputs h and k.

The primary inputs and outputs, the inputs and outputs of each sequential element (i.e., in the example of FIG. 2A, flip-flops 200 and 210 and latches 230 and 240) and each combinational element (in the example of FIG. 2A, AND gate 220) are "signals" as described above. Each signal is assigned an identifier. In FIG. 2A, the signals are identified a, b, c, d, e, f, g, h and k. Signals a and b, and h and k, are primary inputs and outputs, respectively. Signals c and d are the outputs of flip-flops 200 and 210, respectively, and inputs of AND gate 220. Signal e is the output of AND gate 220. Signals f and g are the inputs to latches 230 and 240, respectively.

In clock-driven digital systems, clock cycles may be partitioned into multiple phases; thus, for example, phases of a clock cycle with k clock phases may be denoted 0, 1, . . . , k−1. In general, clock-driven digital systems may be driven by a single clock or by multiple clocks. In the particular example shown in FIG. 2A, the sequential elements (i.e., flip-flops 200, 210 and transparent latches 230, 240) may be assumed to be clock-driven (clock inputs are omitted from the figure for simplicity). Further, for ease of understanding, it may be assumed that all sequential elements, primary inputs and primary outputs run off the same clock.

It is further assumed for ease of understanding that k=2; i.e., that the circuit of FIG. 2A has a 2-phase clock cycle constituted by a phase 0 followed by a phase 1. Let phase 0 be a "clock-high" phase (a phase when the clock is high) and let phase 1 be a "clock-low" phase (a a phase when the clock is low). Further, let the clock-high phase be denoted "H" and let the clock-low phase be denoted "L". H and L may be applied as phase labels.

As described above in connection with FIG. 3, as an initial operation of generating phase synchronous equations, primary I/Os and sequential elements of the circuit are assigned phase labels.

For sequential elements, the phase labels describe the "latest required input phase" and "earliest valid output phase" for each sequential element. "Latest required input phase" refers to the latest phase, during a clock cycle, that a signal can arrive at the input of a sequential element and still be correctly registered by. the sequential element (i.e., stabilize at the correct logic level). For example, for rising-edge flip-flop 200 of FIG. 2A, an input signal should stabilize before the clock goes high, which means that the input signal should arrive before the end of the L phase of the clock.

"Earliest valid output phase" refers to the earliest phase, during a clock cycle, that the sequential element can generate a valid output signal (i.e., output a signal that stabilizes at the correct logic level). Again using rising-edge flip-flop 200 as an example, an output signal of the flip-flop can at earliest stabilize shortly after the clock goes high, which will occur during the H phase of the clock.

Figure 2B:
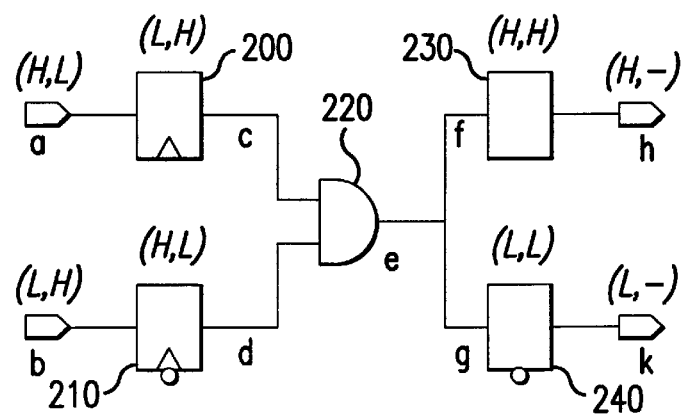
FIG. 2B illustrates the example circuit of FIG. 2A with phase labels assigned to sequential elements and primary I/O.

In view of the foregoing, FIG. 2B shows the circuit of FIG. 2A with phase labels assigned to the sequential elements. The phase labels are assigned with the format "(latest required input phase, earliest valid output phase)". Thus, rising-edge flip-flop 200 has the phase labels (L, H) assigned to it, for the reasons described above. For falling-edge flip-flop 210, naturally, the labels are reversed. By applying the reasoning discussed above in connection with flip-flop 200, it can be seen that transparent latches 230 and 240 should be assigned the phase labels (H, H) and (L, L), respectively, as shown in FIG. 2B.

Signals of the circuit are also assigned phase labels. As noted above, in FIG. 2A, signals are denoted by the letters a through k. The signals correspond to primary inputs, primary outputs, and conductors ("wires") within the circuit.

The phase labels assigned to the signals correspond to an "early phase" and a "late phase". As used herein, "early phase" refers to the earliest valid time for the signal, and "late phase" refers to the latest possible arrival time for the signal. The early phase label reflects the phase-related output characteristics of emitters, while the late phase label reflects the phase-related input characteristics of samplers. More particularly, the early phase label specifies the earliest clock phase during which an output of an emitter can become valid (stabilize at the correct logic level), and the late phase label specifies the latest phase during which a signal can arrive (stabilize at the correct logic level) at the input of a sampler.

It should be noted that for sequential elements, the latest required input phase corresponds to the late phase for signals, and that the earliest valid output phase corresponds to the early phase for signals.

For primary inputs, the early phase label is not known and cannot be determined from the rest of the circuit, because emitters for the primary inputs are in the environment of the circuit, which is unknown. Thus, the early phase labels for primary inputs could be assumed to be some default value, or could be supplied by a user or determined from the environment circuit if it is given.

Symmnetrically, late phase labels for the primary outputs cannot be determined from the rest of the circuit, because samplers of the primary outputs are in the environment, which is unknown. Thus, as in the case of the primary inputs, this information could be provided by a user. Alternatively, the assumption could be made that samplers include both an element with a latest required input phase of H and an element with a latest required input phase of L. In the example illustrated in FIG. 2C, the "–"(dash or hyphen) in the late phase label position of the primary outputs indicates that this information is unknown, or that, potentially, samplers include both an element with a latest required input phase of H and an element with a latest required input phase of L.

FIG. 2B also shows phase labels assigned to the primary I/O.

As discussed above, after phase labels have been assigned to sequential elements and primary I/O, the operations of backward and forward propagation of phase labels from sequential elements and primary I/Os to internal signals may be performed. The propagation operations provide the phase information regarding emitters and samplers needed at each signal to assign phase labels.

For example, referring now to FIG. 2B, to perform backward propagation of late phase labels, the latest required input phase label of transparent latch 230, which has a value of H, would be propagated to signals f, e, c and d. Similarly, the latest required input phase label of transparent latch 240, which has a value of L, would be propagated to signals f, e, c and d.

In the particular example of FIGS. 2A and 2B, there are no signals between primary output h and transparent latch 230. Similarly, there are no signals between primary output k and transparent latch 240. Therefore, no backward propagation occurs between primary output h and transparent latch 230, or between primary output k and transparent latch 240. If there were signals between these elements, the late phase labels of primary outputs h and k would be propagated to the signals.

Again referring to FIG. 2B, to perform forward propagation of early phase labels, the earliest valid output phase label of flip-flop 200, which has a value of H, would be propagated to signals c, e, f and g. Similarly, the earliest valid output phase label of flip-flop 210, which has a value of L, would be propagated to signals d, e, f and g. There are no signals between primary input a and flip-flop 200, or between primary input b and flip-flop 210. Therefore, no forward propagation occurs between primary input a and flip-flop 200, or between primary input b and flip-flop 210. If there were. signals between these elements, the early phase labels of primary inputs a and b would be propagated to the signals.

After backward and forward propagation, rules may be applied to assign phase labels to internal signals. Rules for assigning phase labels to signals are described in the following.

Phase labels for signals are denoted "$(Ph_1(s), Ph_2(S))$", where s is a signal (for example, a–k, referring to FIG. 2A). $Ph_1$ corresponds to the early phase label, and $Ph_2$ corresponds to the late phase label. For sequential elements, the latest required input phase corresponds to $Ph_2$, and the earliest valid output phase corresponds to $Ph_1$.

For a given signal to which phase labels are to be assigned, the phase labels of the transitive fan-in of the signal are analyzed. These phase labels were propagated to respective signals during the forward propagation operation described above. Transitive fan-in refers to all circuit elements "upstream" of a point in a circuit; i.e., elements which may drive signals to that point.

Each path of the transitive fan-in is traversed in the direction of the primary inputs until a sequential element or primary input is encountered, and then the traversal stops. If all sequential elements and/or primary inputs first encountered in such a traversal of the transitive fan-in of a given signal have been assigned the same early phase label $Ph_1$, then that early phase label, $Ph_1$, is assigned as the early phase label of the signal. For example, if all first-encountered sequential elements and/or primary inputs in the transitive fan-in of a given signal have been assigned an early phase label of H, then H is assigned as that signal—s early phase label.

Similarly, the phase labels of the transitive fan-out of the signal are analyzed. These phase labels were propagated to respective signals during the backward propagation operation described above. Transitive fan-out refers to all circuit elements "downstream" of a point in a circuit; i.e., elements which may receive signals driven from that point.

Each path of the transitive fan-out is traversed in the direction of the primary outputs until a sequential element or primary output is encountered, and then the traversal stops. If all sequential elements and/or primary outputs first encountered in such a traversal of the transitive fan-out of the signal have been assigned the same late phase label $Ph_2$, then that late phase label, $Ph_2$, is assigned as the late phase, label of the signal. For example, if all first-encountered sequential elements and/or primary outputs in the transitive fan-out of a given signal have been assigned a late phase label of L, then L is assigned as that signal's late phase label.

The foregoing constitutes a special case of the application of more general rules, described below, to the special case wherein all elements in the transitive fan-in of a signal have the same early phase label, and all elements in the transitive fan-out of the signal have the same late phase label.

A more general rule, referred to herein as the "min" rule, is as follows. If the first-encountered sequential elements and/or primary inputs of the transitive fan-in of a given signal all have the same early phase label $Ph_1$, but the first-encountered sequential elements and/or primary outputs of the transitive fan-out of the signal have late phase labels that differ from each other (i.e., $Ph_2$ for each sequential element or primary output is one of a set $\{Ph_{21}, Ph_{22}, \ldots\}$, then $Ph_1$ is assigned as the signal's early phase label, and $Ph_2$ for the signal is selected from $\{Ph_{21}, Ph_{22}, \ldots\}$ such that the phase difference between $Ph_1$, and $Ph_2$ is the narrowest possible.

Another more general rule, referred to herein as the "max" rule, is as follows. If the first-encountered sequential elements and/or primary inputs of the transitive fan-in of a signal have differing early phase labels $\{Ph_{11}, Ph_{12}, \ldots\}$ but the first-encountered sequential elements and/or primary outputs of the transitive fan-out of the signal have the same late phase label $Ph_2$, then $Ph_2$ is assigned as the signal's late phase label, and Ph, for the signal is selected from $\{Ph_{11}, Ph_{12}, \ldots\}$ such that the phase difference between $Ph_1$ and $Ph_2$ is the widest possible.

Figure 2C:
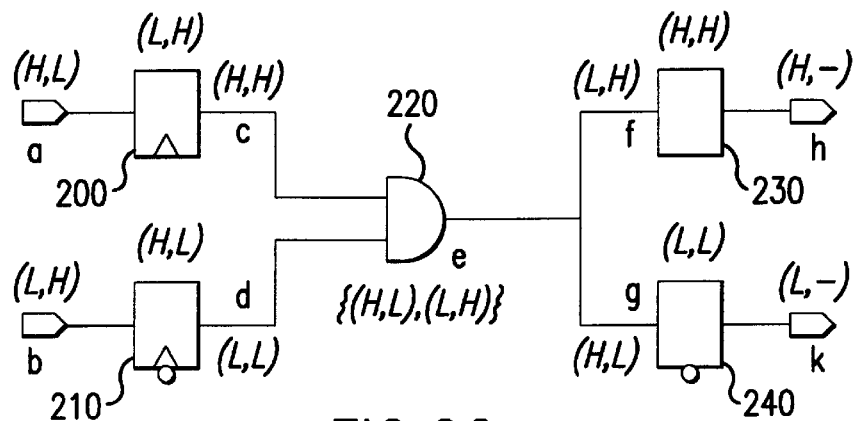
FIG. 2C illustrates the example circuit of FIGS. 2A and 2B with phase labels further assigned to internal signals.

Finally, according to the "multiple"rule, if the first-encountered sequential elements and/or primary inputs of the transitive fan-in of a signal have differing early phase labels $\{Ph_{11}, Ph_{12}, \ldots\}$ and the first-encountered sequential elements and/or primary outputs of the transitive fan-out of the signal have differing late phase labels $\{Ph_{21}, Ph_{22}, \ldots, Ph_2k\}$ then the signal is said to have k instances (one instance per late phase label), as will be explained below, time-multiplexed to a single wire. For each signal instance phase labels are computed independently following the max rule explained above. The signal is labeled with a set of phase labels, one per signal instance. For example, signal e in FIG. 2C is labeled with two pairs of labels $\{(H,L),(L,H)$. Pair (H,L) corresponds to a signal instance $e^H$ and pair (L,H) corresponds to signal instance $e^L$.

FIG. 2C shows the circuit of FIG. 2A with phase labels assigned to the signals. The phase labels for the signals are given in the format "(early phase, late phase)". Thus, for example, signal c, the output of flip-flop 200, is assigned the phase labels (H, H). The assignment of the phase labels (H, H) to signal c is an example of the application of the "min" rule. It can be seen that H is the appropriate early phase label because the first-encountered upstream sequential element, flip-flop 200, has an earliest valid output phase H (or $Ph_1$ value).

H is also the appropriate late phase label for signal c. This may be understood by inspecting the transitive fan-out of signal c. The first-encountered sequential elements in the transitive fan-out of signal c are transparent latches 230 and 240. As indicated by its phase label, for latch 230 the value of input signal c (once it has been propagated through the AND gate 120) should stabilize before the end of the H phase. For latch 240, the value of input signal c need not stabilize until sometime during the L phase. Thus, there are two different constraints on the latest possible arrival time for signal c. In this case, the H phase is the more stringent requirement, since signal c is emitted during the H phase. Accordingly, the H phase is assigned as the late phase label for signal c.

It may be observed, given the logic of the circuit of FIG. 2A, that signal e can change its value two times during one clock cycle. Accordingly, signal e may be treated in a manner analogous to a manner in which a time-multiplexed signal would be treated. The signal e may be considered to correspond to a plurality of signal "instances". Signal instances may be considered to be independent signals which are time-multiplexed on the same wire. The most common use for signal instances is modeling different stable values per clock.

If a circuit being modeled uses multiple clocks, an additional label is assigned that indicates which clock the phase labels are associated with. If the circuit being modeled only involves one clock, then the third label is not assigned.

The foregoing is a demonstration of at least one advantageous aspect of embodiments of the invention, wherein the task of assigning phase labels is fully automated, eliminating the need for tedious manual calculation and coding of phase labels, and enabling increased productivity.

As noted above, after phase labels are assigned, the process according to the invention may construct phase synchronous equations, based on information in the circuit and the information derived during phase labeling.

The phase synchronous equations may be constructed based on a phase shift operator. For a given clock with k clock phases as described above, where 0 through k–L are integers, and phase labels $Ph_i$, $Ph_j$ identify phases i, j, with $0 < i, j < k-L$, the shift operator from clock phase $Ph_j$ to phase $Ph_i$ is defined as:

$$\text{Shift}(Ph_i, Ph_j) = |Ph_i - Ph_j| \backslash k$$

Based on the above formulation, for circuits utilizing a single two-phase clock such as the circuit illustrated in FIGS. 2A–2C, the shift operator value is 0 if $Ph_i = Ph_j$, and 0.5 if $Ph_i \ne Ph_j$ (recalling that H and L correspond to a phase 0 and a phase 1, respectively). Accordingly, phase synchronous equations derived for such circuits will contain either a 0 or 0.5 shift operator value, as described in greater detail below.

Each signal of a modeled circuit may be represented by a general phase synchronous equation in which the output signal transmitted by a circuit element is a function of a clocking index i and the phase shift operator. For example, such an equation for a flip-flop with input x and output y is $y(i) = x(i-1 + \text{Shift}(Ph_1(y), Ph_1(x)))$ where the initial value of y(i) is $y(i_0)$. The symbol $i_0$ indicates the initial value of the clock index. The shift operator in this equation computes a phase shift between the early phase labels of the input and output signals of a flip-flop.

The second phase label of signal s, $Ph_2(s)$ is used to select the correct signal instance of s if multiple instances of s exist. The correct instance of s should have $Ph_2(s)$ corresponding to the latest possible arrival phase of a flip-flop.

In the case of the circuit shown in FIGS. 2A–2C which utilizes a two-phase clock, the clocking index i $\in \{0, 1, 2, \ldots\}$ for signal instances with an early phase label of H, and the clocking index i $\in \{-0.5, 0.5, 1.5, \ldots\}$ for signal instances with an early phase label of L. The initial clock value $i_0 = -0.5$ for signal instances with an early phase label of L, and $i_0 = 0$ would be the initial clock value for signal instances with an early phase label of H.

Thus, for example, the output of falling edge flip-flop 210 may be represented by the equation $d(i) = b(i-1)$, i $\in \{0.5, 1.5, \ldots\}$.

The general phase synchronous equation for a transparent latch with input x and output y is $y(i) = x(i - \text{Shift}(Ph_1(x), Ph_1(y)))$ where the initial value of y(i) is $y(i_0)$. Thus, for example, the output of active-high transparent latch 230 may be represented by the equation $h(i) = f(i-0.5)$, i $\in \{2, 3, \ldots\}$, as the phase shift is 0.5.

For a combinational gate with inputs x and z, output y, and function f, a general equation is as follows: $y(i) \ f(x(i+\text{shift}(Ph_1(y), Ph_1(x))), z(i+\text{shift}(Ph_1(y), Ph_1(z))))$. For example, for the output signal e of AND gate 120, the following two equations express behavior of two possible signal instances: $e^H(i) = c(i)d(i+0.5)$, i $\in \{1, 2, 3, \ldots\}$, corresponding to the signal instance having an early phase label of H and a late phase label of L, and $e^L(i) = c(i+0.5)d(i)$, i $\in \{-0.5, 0.5, 1.5, \ldots\}$, corresponding to the signal instance having an early phase label of L and having a late phase label of H Table 2, below, shows the phase synchronous equations that would be derived for the circuit of FIGS. 2A–2C.

TABLE 2

$c(i) = a(i - 1)$ i$\in \{1, 2, \ldots\}$
$d(i) = b(i - 1)$ i $\in \{0.5, 1.5, \ldots\}$
$e^H(i) = c(i)d(i + 0.5)$ i $\in \{0, 1, \ldots\}$
$e^L(i) = c(i + 0.5)d(i)$ i $\in \{-0.5, 0.5, \ldots\}$
$f(i) = e^L(i)$  i $\in \{-0.5, 0.5, \ldots\}$
$g(i) = e^H(i)$  i $\in \{0, 1, \ldots\}$
$h(i) = f(i - 0.5)$  i $\in \{0, 1, \ldots\}$
$k(i) = g(i - 0.5)$  i $\in \{0.5, 1.5, \ldots\}$ A model of a circuit in terms of phase synchronous equations according to embodiments of the invention offers advantages, as described above. The phase synchronous equations achieve an abstract, concise formal model that avoids the occurrence of functional bugs that typically occur in model specifications with a high degree of implementation detail. The model is formal and can be used in logic synthesis, simulation or verification.

Logic synthesis takes an initial description of a netlist usually represented in HDL and produces another netlist optimized for given design criteria such as delay, area, and power. Often the initial netlist is in a more abstract form and has less structure than the optimized netlist. For example, in case of combinational logic the initial netlist may just have one large Boolean function per the primary output. The netlist resulting from logic synthesis typically has more structure (e.g., a large function may be split into smaller gates) and may be optimized (e.g., gates from different functions may be shared).

Embodiments of the present invention enable sequential logic synthesis for circuits with transparent latches and multi-clock/phase clocks since, among other reasons, as noted above, a formal model enabling the application of formal methods of reasoning about the model is generated.

Following logic synthesis, an optimized netlist may be processed by simulation software to debug the logic design represented in the netlist. In simulation, a test case comprising various stimuli may be applied to the design. The application of the test case typically produces, as output, results data representing the response of the simulated design which is compared to expected results, to determine whether the design functions as expected. The design may subsequently be revised to improve performance or de-bug errors.

Figure 4:
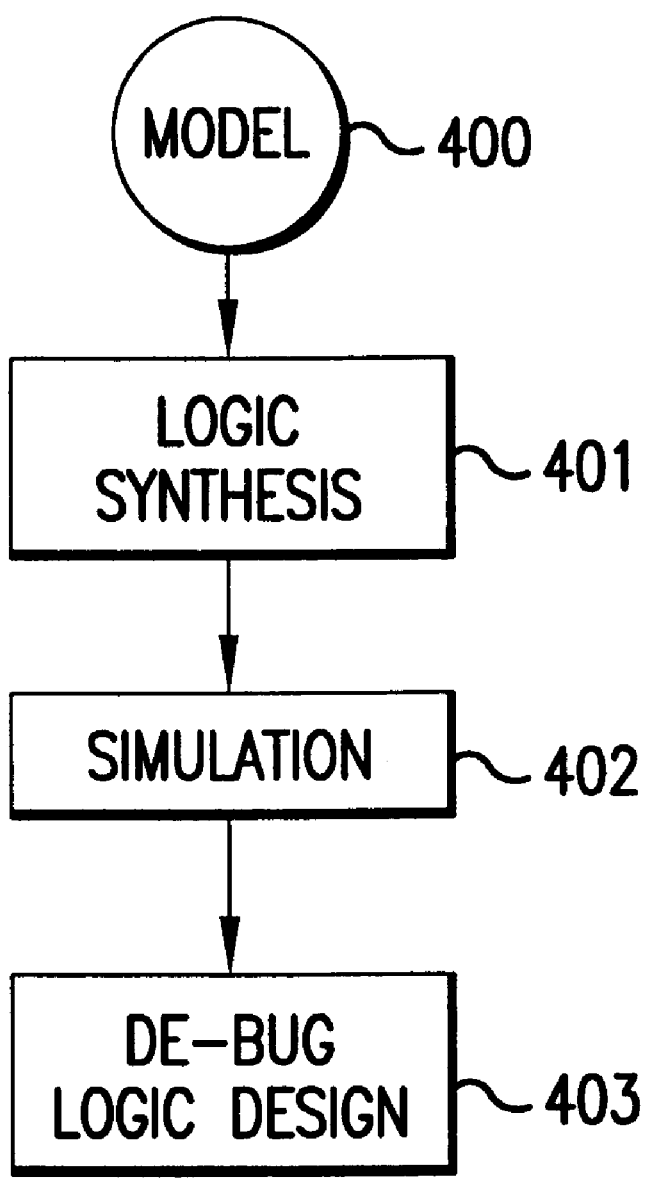
FIG. 4 illustrates a process flow according to one possible application of embodiments of the invention.

Thus, for example, one possible application according to embodiments of the invention is illustrated in FIG. 4. A model 400 comprising phase synchronous equations generated as described above may be input to a logic synthesis process 401. The logic synthesis process 401 may be followed by a simulation process 402. The simulation process may be followed by a process of de-bugging the logic design as shown in block 403.

Software comprising computer-executable instructions according to embodiments of the present invention may be stored and transported on a computer-usable medium such as diskette, magnetic tape, disk or CD-ROM. The instructions may be downloaded to another storage medium such as a ROM or RAM, from which they may be fetched and executed by a processor to effect the advantageous features of the invention.

Several embodiments of the present invention are specifically illustrated and described herein. However, it will be appreciated that modifications and variations of the present invention are covered by the above teachings and within the purview of the appended claims without departing from the spirit and intended scope of the invention.

What is claimed is:

1. A method of deriving an equation corresponding to a sequential element. of a circuit including at least one multiple-phase clock, comprising:

assigning first phase-related information to an input signal of said sequential element;

assigning second phase-related information to an output signal of said sequential element;

constructing an equation which computes a stable value of said output signal based on said first and second phase-related information; and using said equation to de-bug said circuit.

2. The method of claim 1 wherein said first phase-related and second phase-related information describe an earliest valid time for said input and output signal, respectively.

3. The method of claim 1, wherein said stable value is indexed by an index representing phases of said clock, and said index is modified by a modifier based on said first and second phase-related information.

4. The method of claim 1 wherein said modifier has the form $|Ph_i-Ph_j|/k$, where Ph X and Ph j correspond to said first and second phase information and said clock has k phases.

5. The method of claim 4, wherein an equation of the form $y(i)=x(i-1+|Ph_i-Ph_j|/k)$ models an output signal of a flip-flop element of said circuit, where x is an input signal to said flip-flop element and i is said index.

6. The method of claim 4, wherein an equation of the form $y(i)=x(i-|Ph_i-Ph_j|/k)$ models an output signal of a transparent element of said circuit, where x is an input signal to said transparent element and i is said index.

7. (Amended) A computer-uselemed iumtai blyembodying computer-executable instructions, said instructions when executed implementing a process for generating equations that model a circuit including at least one multi-phase clock and a plurality of sequential elements that input and output signals, comprising:

(i) assigning first phase-related information to said sequential elements and to primary inputs and outputs of said circuit;

(ii) assigning second phase-related information to said signals based on said first phase-related information; and (iii) forming equations corresponding to said circuit, said equations representing said signals and incorporating said second phase-related information.

8. The computer-usable medium of claim 7, wherein said equations compute a stable value indexed by an index representing phases of said clock, and said index is modified by a modifier based on said second phase-related information.

9. The computer-usable medium of claim 7, wherein (ii) further comprises:

for each of said signals, providing said first phase-related information from its transitive fan-in and transitive fan-out; and applying rules to said first phase-related information to assign said second phase-related information.

10. The computer-usable medium of claim 9, wherein said rules relate to phase-related input and output characteristics of said transitive fan-in and transitive fan-out.

* * * * *

UNITED STATES PATENT AND TRADEMARK OFFICE
CERTIFICATE OF CORRECTION

PATENT NO. : 6,584,597 B1  
DATED : June 24, 2003  
INVENTOR(S) : Kishinevsky et al.

It is certified that error appears in the above-identified patent and that said Letters Patent is hereby corrected as shown below:

Column 5,  
Line 48, change "registered by. the" to -- registered by the --.

Column 7,  
Line 15, after "were" delete ".".  
Line 22, change "$Ph_1(s), Ph_2(S))$" to $Ph_1(s), Ph_2(s))$ --

Column 9,  
Line 23, change "0 through k-L are" to -- 0 through k-1 are --.  
Line 25, change "$0<i, j<k-L$" to -- $0 \leq i, j \leq k-1$ --  
Line 27, change "$Shift(Ph_i, Ph_j)=|Ph_i-Ph_j|\backslash k$" to -- $Shift(Ph_i, Ph_j)=|Ph_i-Ph_j|/k$ --  
Line 67, change "phase shiftis 0.5" to -- phase shift is 0.5 --.

Column 11,  
Liine 33, change "Ph X and Ph j" to -- $Ph_i$ and $Ph_j$ --.

Column 12,  
Line 5, delete the entire line and replace with -- 7. A computer-usable medium tangibly embody- --.

Signed and Sealed this

Tenth Day of August, 2004

JON W. DUDAS  
*Acting Director of the United States Patent and Trademark Office*